United States Patent
Hsu et al.

(10) Patent No.: US 11,545,455 B2
(45) Date of Patent: Jan. 3, 2023

(54) SEMICONDUCTOR PACKAGING SUBSTRATE FINE PITCH METAL BUMP AND REINFORCEMENT STRUCTURES

(71) Applicant: Apple Inc., Cupertino, CA (US)

(72) Inventors: Jun Chung Hsu, Taoyuan (TW); Chih-Ming Chung, Cupertino, CA (US); Jun Zhai, Cupertino, CA (US); Yifan Kao, Taoyuan (TW); Young Doo Jeon, San Jose, CA (US); Taegui Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/423,931

(22) Filed: May 28, 2019

(65) Prior Publication Data

US 2020/0381383 A1 Dec. 3, 2020

(51) Int. Cl.
*H01L 23/00* (2006.01)

(52) U.S. Cl.
CPC .............. *H01L 24/14* (2013.01); *H01L 24/11* (2013.01); *H01L 24/13* (2013.01); *H01L 2224/11003* (2013.01); *H01L 2224/11424* (2013.01); *H01L 2224/11464* (2013.01); *H01L 2224/11614* (2013.01); *H01L 2224/13083* (2013.01);

(Continued)

(58) Field of Classification Search
CPC ......... H01L 24/11; H01L 24/13; H01L 24/14; H01L 21/4857; H01L 23/49811; H01L 23/49822; H01L 2224/11003; H01L 2224/11424; H01L 2224/11614; H01L 2224/13083; H01L 2224/13144; H01L 2224/13147; H01L 2224/13155; H01L 2224/13164; H01L 2224/14517; H01L 2224/81005; H01L 2224/24992; H01L 2224/2501; H01L 2224/81001–81005; H01L 2224/22–224; H01L 2224/81101; H01L 2224/11334; H01L 2224/26175; H01L 23/16; H01L 2224/27013; H05K 3/205; H05K 3/20
See application file for complete search history.

(56) References Cited

U.S. PATENT DOCUMENTS 6,420,664 B1    7/2002    Muramatsu et al.
6,614,122 B1 *   9/2003    Dory ..................... H01L 21/563
                                                                              257/783

(Continued)

FOREIGN PATENT DOCUMENTS

| KR | 20030075814 A | 9/2003 |
|----|---------------|--------|
| WO | 2017024847 A1 | 2/2017 |
| WO | 2017078849 A1 | 5/2017 |

OTHER PUBLICATIONS

International Patent Application No. PCT/US2020/033857, "International Search Report and Written Opinion" dated Sep. 7, 2020, 14 pages.

*Primary Examiner* — Alia Sabur
(74) *Attorney, Agent, or Firm* — Aikin & Gallant, LLP

(57) ABSTRACT

Semiconductor packaging substrates and processing sequences are described. In an embodiment, a packaging substrate includes a build-up structure, and a patterned metal contact layer partially embedded within the build-up structure and protruding from the build-up structure. The patterned metal contact layer may include an array of surface mount (SMT) metal bumps in a chip mount area, a metal dam structure or combination thereof.

22 Claims, 13 Drawing Sheets

(52) U.S. Cl.
CPC ............... *H01L 2224/13144* (2013.01); *H01L 2224/13147* (2013.01); *H01L 2224/13155* (2013.01); *H01L 2224/13164* (2013.01); *H01L 2224/14517* (2013.01)

(56) References Cited

U.S. PATENT DOCUMENTS

| | | | | |
|---|---|---|---|---|
| 7,550,856 | B2* | 6/2009 | Libres | H01L 21/563 |
| | | | | 257/777 |
| 7,635,641 | B2* | 12/2009 | Hurwitz | H05K 3/4647 |
| | | | | 438/612 |
| 8,181,342 | B2* | 5/2012 | Chiang | H05K 3/4682 |
| | | | | 29/852 |
| 8,569,894 | B2* | 10/2013 | Su | H01L 23/49816 |
| | | | | 257/778 |
| 9,607,959 | B2* | 3/2017 | Pan | H01L 25/50 |
| 9,899,239 | B2* | 2/2018 | Hsu | H01L 24/97 |
| 10,157,888 | B1 | 12/2018 | Lin et al. | |
| 10,242,956 | B1* | 3/2019 | Lee | H01L 23/58 |
| 2008/0265399 | A1* | 10/2008 | Chao | H01L 23/49816 |
| | | | | 257/698 |
| 2009/0072407 | A1* | 3/2009 | Furman | H01L 25/50 |
| | | | | 257/762 |
| 2009/0321932 | A1* | 12/2009 | Gonzalez | H01L 21/6835 |
| | | | | 257/750 |
| 2010/0072588 | A1 | 3/2010 | Yang | |
| 2010/0288549 | A1* | 11/2010 | Chiang | H05K 3/4682 |
| | | | | 29/847 |
| 2011/0260317 | A1 | 10/2011 | Lu et al. | |
| 2011/0298123 | A1* | 12/2011 | Hwang | H01L 24/11 |
| | | | | 257/737 |
| 2014/0352135 | A1* | 12/2014 | Hu | H05K 1/119 |
| | | | | 29/592.1 |
| 2015/0061142 | A1* | 3/2015 | Hsu | H01L 25/50 |
| | | | | 257/773 |
| 2016/0037635 | A1 | 2/2016 | Chou | |
| 2016/0056102 | A1* | 2/2016 | Konchady | H01L 23/5383 |
| | | | | 174/263 |
| 2016/0366762 | A1* | 12/2016 | Lin | H01L 25/065 |
| 2016/0379938 | A1* | 12/2016 | Kodani | H01L 23/562 |
| | | | | 257/668 |
| 2017/0362733 | A1* | 12/2017 | Kohiki | C25D 5/611 |
| 2019/0148169 | A1* | 5/2019 | Hirano | H01L 23/49822 |
| | | | | 438/125 |
| 2020/0212886 | A1* | 7/2020 | Kawasaki | H01L 23/12 |

* cited by examiner

SEMICONDUCTOR PACKAGING SUBSTRATE FINE PITCH METAL BUMP AND REINFORCEMENT STRUCTURES

BACKGROUND

Field

Embodiments described herein relate to semiconductor packaging, and more particularly to metal bump and mechanical reinforcement structures.

Background Information

Miniaturization is the trend in the semiconductor industry to drive small form factor to be thinner. Coreless substrates, and particularly those with Ajinomoto build-up film (ABF) based materials, have been used in industry to make thin dielectric layers without glass woven reinforcement. Such thin substrates however are intrinsically weaker from the mechanical perspective, particularly due to no thick inner core.

Additionally, advanced flip chip packaging substrates require finer bump pitch in order to support smaller wafer node technologies. In some implementations, conventional solder on pad (SOP) surface finishes tend to support only greater than 100 μm bump pitch due to yield and tool limitations. Surface mount (SMT) metal bump has been introduced to industry to accommodate finer bump pitch where the packaging substrate SMT metal bumps serve as the functional via landing pads for die connection.

SUMMARY

Packaging substrates and methods of fabrication are described for forming a patterned metal base layer including an array of SMT metal bumps, metal dam structure, or combination thereof in which the patterned metal base layer is partially embedded within and protrudes from a build-up structure. The SMT metal bumps and metal dam structures in accordance with embodiments may have characteristic straight sidewalls for a portion of the patterned metal base layer that is embedded in the build-up structure and a portion of the patterned metal base layer that extends above a topmost surface of the build-up structure laterally adjacent to the SMT metal bump or metal dam structure.

The patterned metal base layer in accordance with embodiments may be manifested using an etch-back technique in which the etch-back operation may be performed before or after formation of a surface finishing layer.

DETAILED DESCRIPTION

Figure 1:
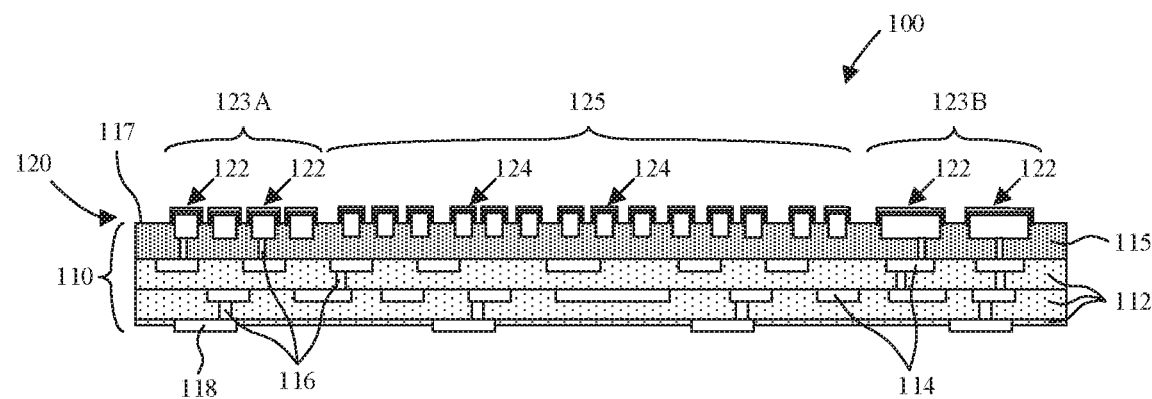
FIG. 1 is a close-up cross-sectional side view illustration of a packaging substrate including a build-up structure and a patterned metal contact layer partially embedded within the build-up structure and protruding from the build-up structure in accordance with an embodiment.

Embodiments describe semiconductor packaging substrate processing sequences and structures in which both surface mount (SMT) metal bumps and reinforcement structures may be simultaneously formed to achieve both fine bump pitch and structural reinforcement.

It has been observed that SMT metal bump technology is faced with challenges of achieving precise and robust bump diameter and height, particularly for application with multiple dies with large size in a multi-chip module (MCM). The SMT metal bump structures in accordance with embodiments are fabricated using processing sequences in which the SMT metal bumps (also referred to herein simply as metal bumps) are manifested after etching (thinning) of the packaging substrate build-up structure. In accordance with embodiments, the metal bumps can be formed by a lithographic process that results in the metal bumps being embedded in a dielectric layer such as the top dielectric layer (encapsulation) for a packaging substrate build-up structure. For example, this may be a coreless substrate. This is followed by metal seed etching that does not attack metal bump (pad) sidewall and keeps the pad size as a design value. Additionally, there is no need for additional copper post plating. Various kinds of surface finish can be integrated with metal bump formation such as electroless nickel electroless palladium immersion gold (ENEPIG), organic solderability preservatives (OSP), etc.

It has been observed that electrical failures may occur in thin packaging substrates such as coreless substrates during thermal cycling, drop test, etc. due to via or trace cracking at die corners. It has additionally been observed that die underfill volume around die corners can be inconsistent. The reinforcement structures in accordance with embodiments can mechanically reinforce the packaging substrate at designated locations to resist mechanical stress and against manufacturing and reliability issues under harsh conditions. Furthermore, the reinforcement structures can confine underfill material flow at designated locations and maintain shape (e.g. fillet). For example, the reinforcement structures may maintain enough underfill material at the die corners to cover at least 50% of the die silicon thickness. The reinforcement structures may additionally be engineered to accommodate different types of underfill material by various kinds of surface finish or post-treatment (e.g. Ni/Au, Ni, grain size and metal organic coating). Of further significance, the reinforcement structures may be formed simultaneously with the SMT metal bump patterns providing an integrated approach and structure for fine pitch die attach and packaging substrate reinforcement.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a close-up cross-sectional side view illustration is provided of a packaging substrate 100 including a build-up structure 110, and a patterned metal contact layer 120 partially embedded within the build-up structure 110 and protruding from the build-up structure. It is to be appreciated this illustration of FIG. 1 is of only a portion of the packaging substrate 100 illustrating several related features. As shown, the patterned metal contact layer 120 includes an array of surface mount (SMT) metal bumps 122 in landing areas 123A, 123B, etc. The SMT metal bumps 122 in accordance with embodiments may function as landing pads and are sized and spaced depending upon the device structure to be mounted. For example, SMT metal bumps 122 in landing area 123A may be sized to receive a chip (or die) such as SoC chip. SMT metal bumps 122 in landing area 123B may be larger and sized to receive a chip scale package (CSP). The patterned metal contact layer 120 may additionally include a metal dam structure 124 in a support area 125. The metal dam structure 124 may be formed laterally adjacent to the SMT metal bumps 122 in the landing 123A, 123B.

The build-up structure 110 may include one or more dielectric layers 114 and metal routing layers 114. Vias 116 may be used to connect metal routing layers 114. Vias 116 may additionally be used to connect the metal routing layers 114 to the STM metal bumps 122 and contact pads 118 on a back side of the packing substrate 100. For example, contact pads 118 may be to receive solder bumps (e.g. ball grid array) for mounting onto a circuit board. Still referring to FIG. 1, the build-up structure 110 may include a top dielectric layer 115 within which the metallization layer 120 is embedded. Alternatively, the metallization layer can be embedded within multiple layers of the build-up structure 110.

The build-up structure 110 in accordance with embodiments may be formed using thin film processing techniques. For example, the build-up structure 100 may be formed using a semi-additive ABF process including lamination and curing steps of ABF resin, laser via opening formation, and copper plating for form the vias 116 and metal routing layers 114. In accordance with embodiments, the dielectric layers 112, 115 may be non-glass reinforced organic materials. Furthermore, the packaging substrate 100 may be a coreless substrate. The metal dam structure 124 in accordance with embodiments may provide structural integrity to the packaging substrate 100, without requiring additional mechanical support from a core or glass reinforcement. Nevertheless, the metal dam structures 124 in accordance with embodiments do not preclude the incorporation of a core or glass reinforcement.

Figure 2:
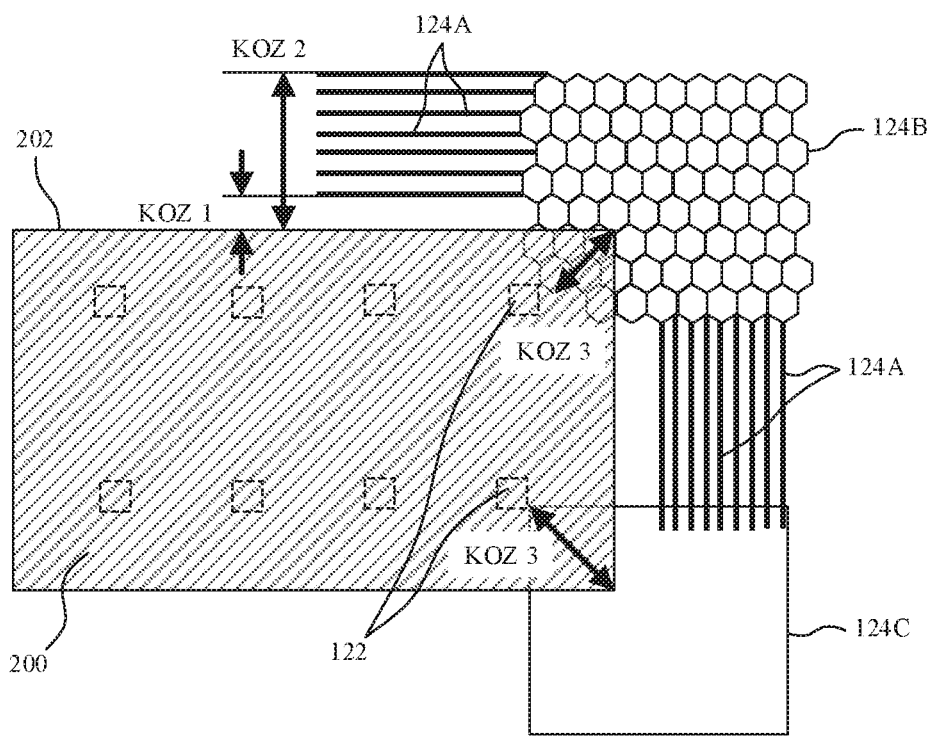
FIG. 2 is a schematic top view illustration of various metal dam structures in accordance with embodiments.

Referring now to FIG. 2 a schematic top view illustration is provided of various metal dam structures in accordance with embodiments. In an embodiment, the metal dam structure 124 includes a plurality of parallel metal lines 124A running parallel to an edge 202 of a device 200 mounted on the array of SMT metal bumps 122. In an embodiment, the metal dam structure 124 includes an array of repeating geometrical shapes 124B or metal plane 124C adjacent to a corner of a device 200 mounted on the array of SMT metal bumps. In an embodiment, the metal dam structure 124 may laterally surround (e.g. completely laterally surround) the array of SMT metal bumps 122 in the chip mount area 125. A variety of metal dam structures are possible.

In one aspect, the metal dam structures 124 can provide mechanical integrity to the packaging substrate 100 due to bending and thermal cycles, and additional can function to contain underfill material for devices (e.g. chips, CSPs) mounted on the packaging substrate. For example, the metal lines 124A may serves as rebar. The metal dam structures can also be customized, such as honey-comb like, metal plane, grid, etc. at the shadow of the device (e.g. chip, CSP) corner. In particular, it has been observed that stress can be focused at the mounted device (e.g. chip, CSP) corners resulting in trace cracking. In the particular embodiments illustrated in FIG. 2, the metal dam structures 124 are directly underneath the mounted device 200 corners.

The metal dam structures 124 and mounted device 200 arrangement may additionally be characterized by various keep out zones (KOZ1, KOZ2, KOZ3). For example, metal lines 124A may be placed a lateral distance away from the mounted device 200 edge 202 defined by KOZ1. The far edge of the metal dam structure 124 may be defined by KOZ2. Additionally, encroachment of the metal dam structure 124 underneath the mounted device 200 closest to the nearest SMT metal bump 122 may define KOZ3. For example, this distance may be less than 800 μm on dispensing side. Shadowing of the metal dam structures 124 underneath the mounted device 200 corners may help keep underfill material and/or provide denser mechanical support structure at these high stress areas.

Surface energy of the metal dam structure can additionally be engineered to accommodate different types of underfill materials by integrating various kinds of surface finishing layers or post-treatment. In some embodiments the patterned metal contact layer 120 may include a same bulk metal layer and a same surface finishing layer over the bulk metal layer for both the SMT metal bumps 122 and the metal dam structures 124. Using the etch-back fabrication technique in accordance with embodiments both the SMT metal bumps and metal dam structures 124 may have characteristic straight sidewalls for a portion that is embedded in the build-up structure and a portion that extends above a topmost surface 117 of the build-up structure that is laterally adjacent. Final structural characteristics of the SMT metal bumps and metal dam structures 124 may be dependent upon whether etch-back is performed before or after surface finishing. Additional structures can also be added, including the formation of trenches in the build-up structure between the array of SMT metal bumps and the metal dam structure, and raising the metal dam structure such that it protrudes above the array of SMT metal bumps.

Figure 3A:
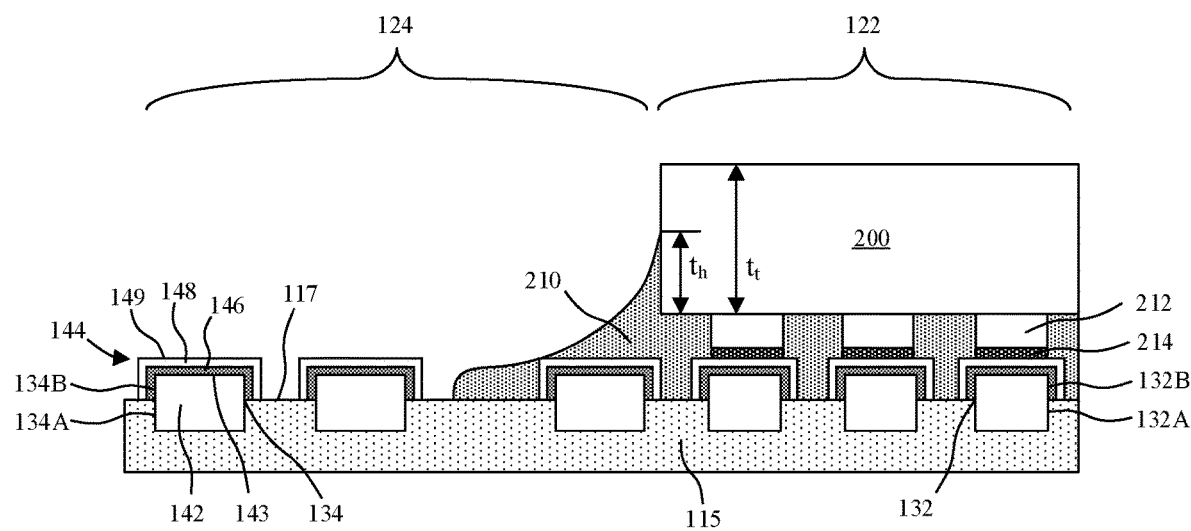
FIG. 3A is a close-up cross-sectional side view illustration of a semiconductor package including a device mounted on a packaging substrate fabricated with a surface finish after etch-back technique in accordance with an embodiment.
Figure 3B:
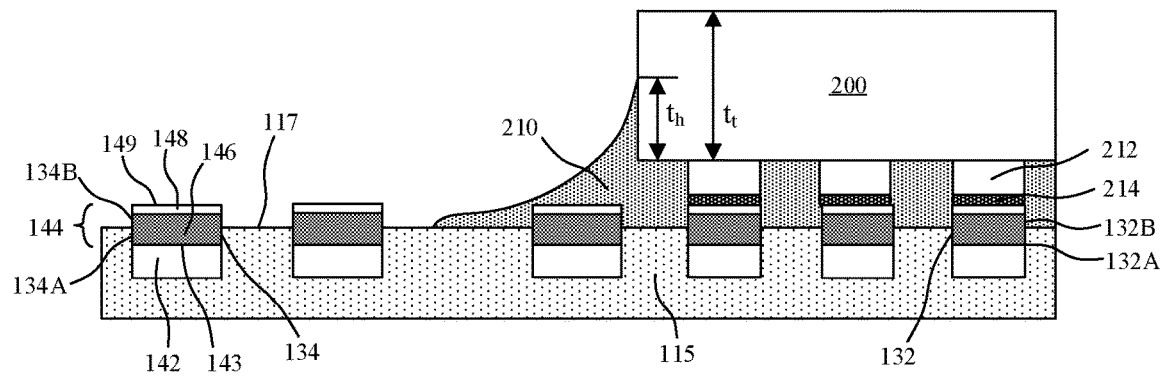
FIG. 3B is a close-up cross-sectional side view illustration of a semiconductor package including a device mounted on a packaging substrate fabricated with a surface finish before etch-back technique in accordance with an embodiment.

FIG. 3A is a close-up cross-sectional side view illustration of a semiconductor package including a device 200 mounted on a packaging substrate fabricated with a surface finish after etch-back technique in accordance with an embodiment. FIG. 3B is a close-up cross-sectional side view illustration of a semiconductor package including a device 200 mounted on a packaging substrate fabricated with a surface finish before etch-back technique in accordance with an embodiment. Referring to both FIGS. 3A-3B, device 200 including contacts 212 (e.g. studs, pads, etc.) is mounted on the SMT metal bumps 122, and underfilled with an underfill material 210. Device 200 may be bonded using solder bumps 214 for example. The metal dam structures 124 may function to retain the underfill material 210 underneath, and along the device edges, and may prevent further spreading of the underfill material 210 across the surface of the packaging substrate. In an embodiment, the underfill material wicks along the device edges such that an underfill height ($t_h$) along the device edges covers at least 50% of the device 200 thickness ($t_r$), for example at least 50% of a silicon die thickness.

The patterned metal contact layer 120 in accordance with embodiments may be a multi-layer structure. As illustrated, the patterned metal contact layer 120 can include a bulk metal layer 142 (e.g. copper) and a surface finishing layer 144 over the bulk metal layer 142. The surface finishing layer may also be a multi-layer structure. The particular embodiment illustrated shows an ENEPIG structure including electroless nickel layer 146, and electroless palladium and immersion gold layer 148. In accordance with embodiments, each SMT metal bump 122 includes straight sidewalls 132 for a portion 132A of the SMT metal bump that is embedded in the build-up structure and a portion 132B of the SMT metal bump that extends above a topmost surface 117 of the build-up structure laterally adjacent to the SMT metal bump 122. Similarly, each metal dam structure 124 includes straight sidewalls 134 for a portion 134A of the metal dam structure 124 that is embedded in the build-up structure and a portion 134B of the metal dam structure that extends above a topmost surface 117 of the build-up structure laterally adjacent to the metal dam structure 124.

Referring now specifically to FIG. 3A, for both the SMT metal bumps 122 and metal dam structures 124, a top surface 143 of the bulk metal layer 142 extends above a topmost surface 117 of the immediately laterally adjacent build-up structure. Additionally, for both the SMT metal bumps 122 and metal dam structures 124, the straight sidewalls 132, 134 are defined by the bulk metal layer 142, and the surface finishing layer 144 covers both the top surface 143 of the bulk metal layer 142 and the straight sidewalls 132, 134 of the portions 132B, 134B of the SMT metal bump 122 and metal dam structure 124, respectively, that extend above the immediately laterally adjacent topmost surface 117 of the build-up structure. In this manner, the bulk metal layer 142 (e.g. copper) is completely encapsulated by the build-up structure and surface finishing layer 144.

Referring now specifically to FIG. 3B, the straight sidewalls 132, 134 for each SMT metal bump 122 and each metal dam structure 124 span the bulk metal layer 142 and the surface finishing layer 144. As shown, the bulk metal layer 142 for each SMT metal bump 122 and each metal dam structure 124 is completely embedded in the build-up structure and covered by the surface finishing layer 144. Additionally, each surface finishing layer 144 for each SMT metal bump 122v and each metal dam structure 124 is partly embedded in the build-up structure and partly extends above the topmost surface 117 of the immediately laterally adjacent build-up structure. For example, this may be with the nickel layer 146.

Still referring to FIGS. 3A-3B, in accordance with embodiments the underfill material 210 may extend, or flash outward from the device 200 and cover some, but not all of the adjacent metal dam structures 124. In this manner, multiple metal dam structures 124, such as parallel lines or repeating geometric patterns can be used to support one another. Additionally, the multiple metal dam structures 124 may function to provide mechanical support rather than to contain the underfill material 210. Additionally, the metal dam structures 124 may be in a shadow the device 200, such they are at least partially located underneath (and interior to) a side edge or corners(s) of the device 200.

Figure 4:
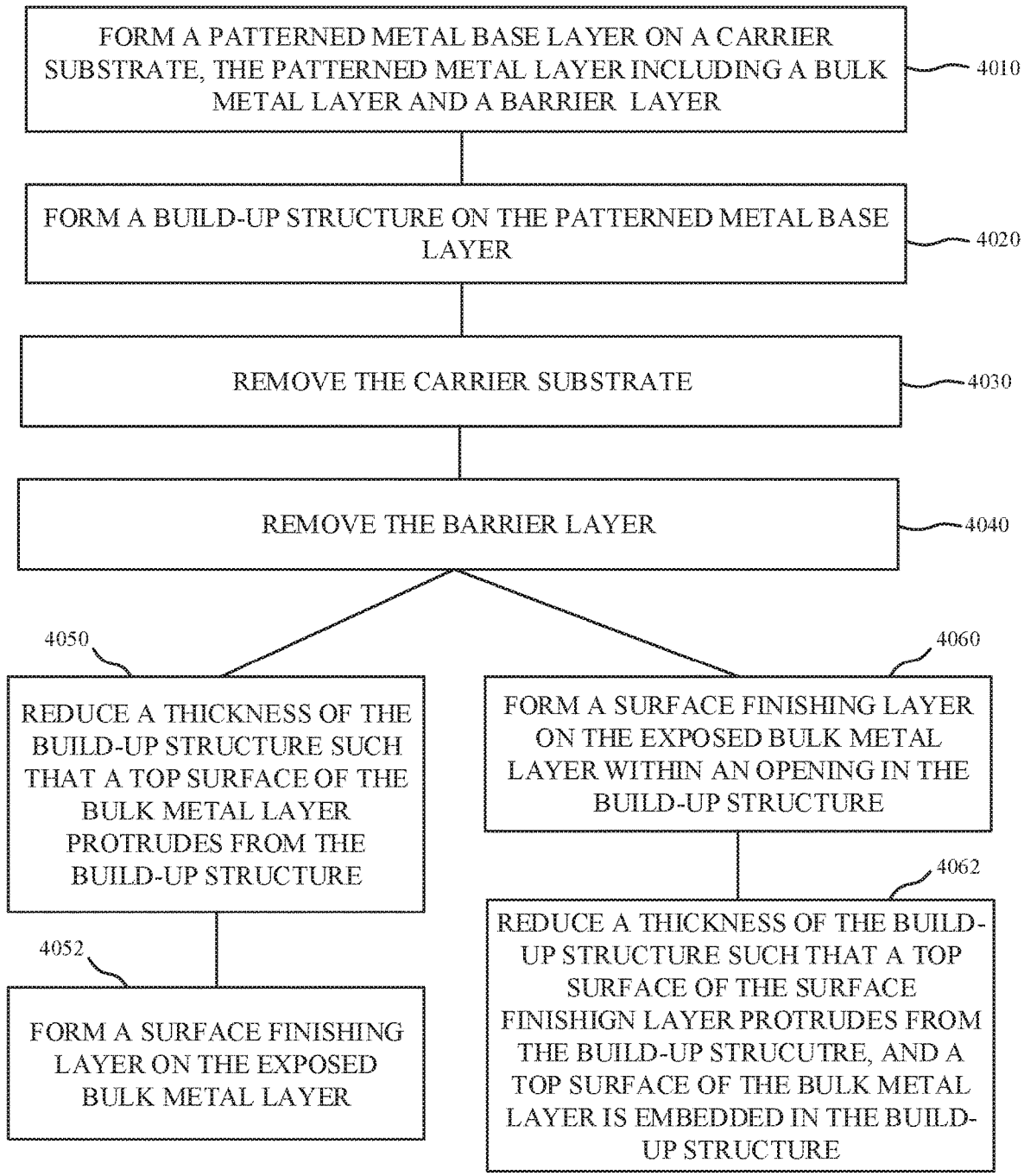
FIG. 4 is a flow chart illustrating methods of fabricating a packaging substrate with a surface finish after etch-back technique and a surface finish before etch-back technique in accordance with embodiments.

FIG. 4 is a flow chart illustrating methods of fabricating a packaging substrate with a surface finish after etch-back technique and surface finish before etch-back technique in accordance with embodiments. FIGS. 5A-5G are schematic cross-sectional side view illustrations of surface finish after etch-back fabrication sequence in accordance with an embodiment. FIGS. 6A-6G are schematic cross-sectional side view illustrations of surface finish before etch-back fabrication sequences in accordance with an embodiment. In interest of clarity and conciseness, the flow chart of FIG. 4 is described concurrently with the sequences illustrated in FIGS. 5A-5G and FIGS. 6A-6G.

Figure 5A:
FIGS. 5A-5G are schematic cross-sectional side view illustrations of a surface finish after etch-back fabrication sequence in accordance with an embodiment.
Figure 5B:
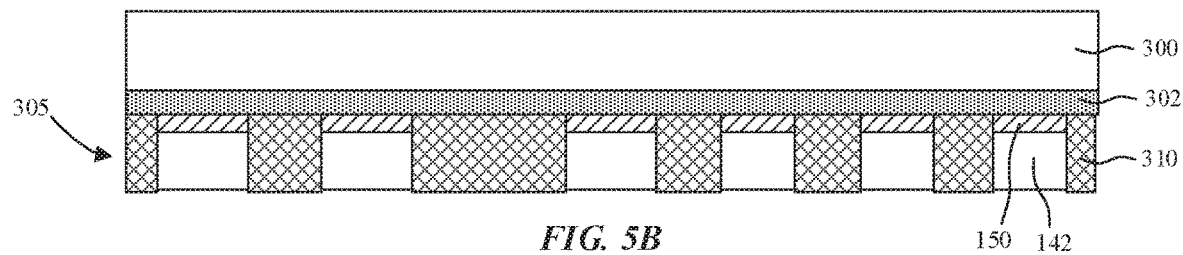
Figure 5C:
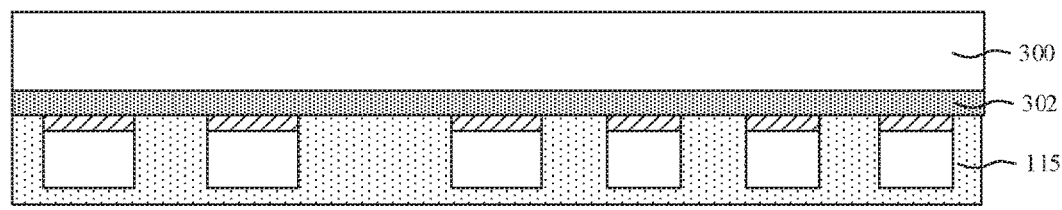
Figure 5D:
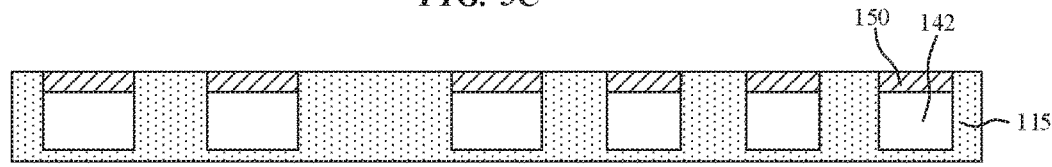
Figure 5E:
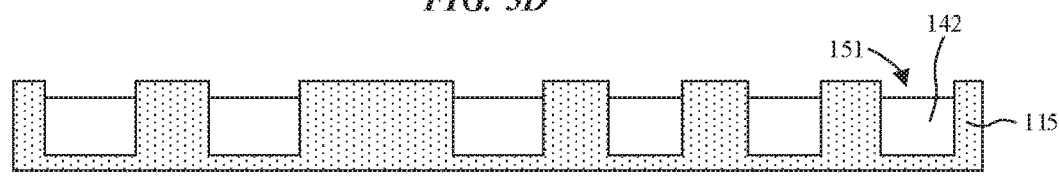

At operation 4010 a patterned metal base layer 305 is formed on a carrier substrate 300. For example, the patterned metal base layer 305 can include a bulk metal layer 142 and a barrier layer 150. As shown in FIGS. 5A-5B and FIGS. 6A-6B, this may be accomplished by forming a seed layer 302 (e.g. copper) on a carrier substrate 300, followed by formation of a dry film photoresist 310 and plating of barrier layer 150 and bulk metal layer 142. In an embodiment, the barrier layer 150 may be formed of a material that functions as an etching barrier during removal of the seed layer 302. Barrier layer 150 is also a temporary layer that facilitates the etch-back technique. As illustrated the total height of the barrier layer 150 and bulk metal layer 142 can be less than total thickness of the dry film photoresist 310 to control SMT metal bump height. However, subsequent planarization can also be performed. Referring now to FIGS. 5C and 6C, the dry film photoresist 310 is removed, and at operation 4020 a build-up structure is formed on the patterned metal base layer 305. In the particular embodiment illustrated, only a single top dielectric layer 115 of the build-up structure is illustrated, though the complete build-up structure of FIG. 1 may be formed. At this stage, the patterned metal base layer 305 is embedded in the build-up structure (e.g. the top dielectric layer 115).

Referring now to FIGS. 5D-5E and FIGS. 6D-6E, at operation 4030 the carrier substrate 300 and seed layer 302 are removed. The barrier layer 150 may protect the copper bulk metal layer 142 during removal of the copper seed layer 302. The barrier layer 150 is then removed, resulting in an opening 151 or recess n the build-up structure. At this stage the bulk metal layer 142 is recessed inside the build-up structure.

Thickness of the bulk metal layer 142 may be dependent upon the particular processing sequence. For example, in the sequence illustrated in FIGS. 5A-5G, the barrier layer 150 may have a minimal thickness required to function as an etch barrier. In the sequence illustrated in FIGS. 6A-6G however, the barrier layer 150 may be thicker, and removal of the barrier layer may leave a recess in the build-up structure above the bulk metal layer 142 that is sufficient to form the surface finishing layer 144. Likewise, relative thicknesses of the bulk metal layer 142 may be dependent upon the processing sequence.

Figure 5F:
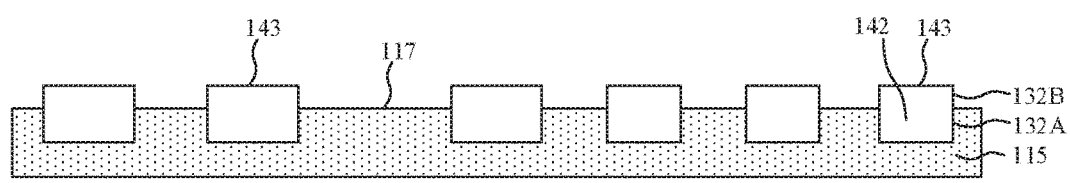
Figure 5G:
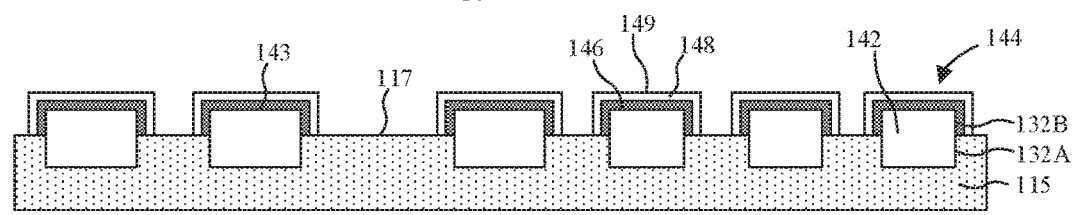

In a surface finish after etch-back fabrication sequence illustrated in FIG. 5F, a thickness of the build-up structure (e.g. top dielectric layer 115) is reduced at operation 4050 such that a top surface 143 of the bulk metal layer 142 protrudes from the build-up structure (e.g. is above topmost surface 117 of the build-up structure). In an embodiment, etch-back is a plasma dry etching or wet chemical etching technique. For example, this may include $CF_4$ chemistry or chemical mechanical polishing (CMP). The surface finishing layer 144 may then be formed on the exposed bulk metal layer 142 at operation 4052, as illustrated in FIG. 5G.

Figure 6A:
FIGS. 6A-6G are schematic cross-sectional side view illustrations of a surface finish before etch-back fabrication sequence in accordance with an embodiment.
Figure 6B:
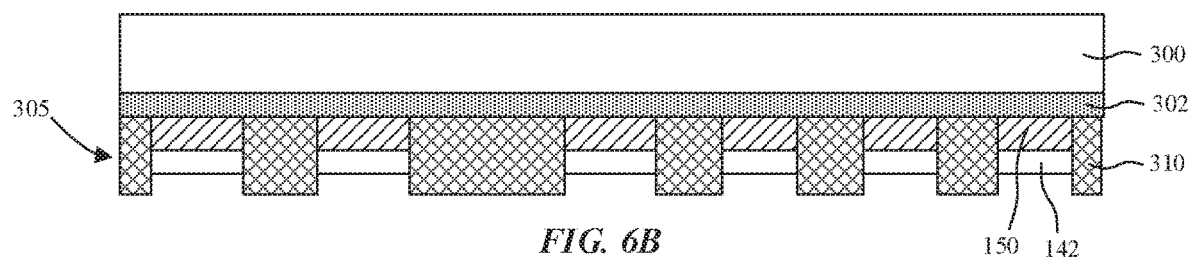
Figure 6C:
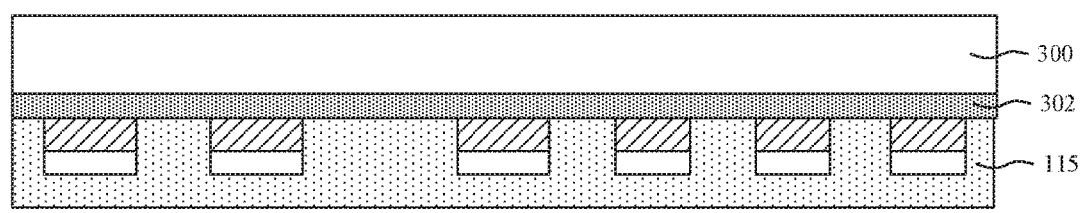
Figure 6D:
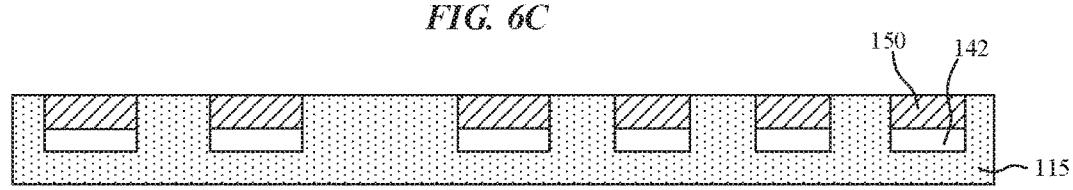
Figure 6E:
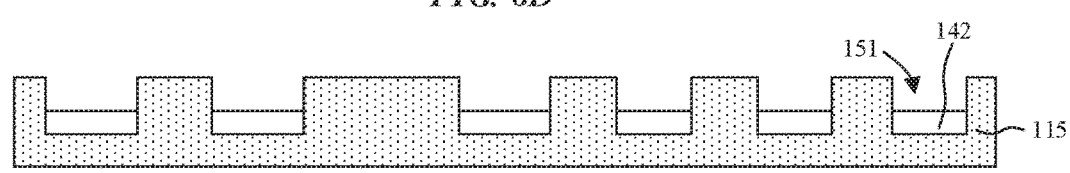
Figure 6F:
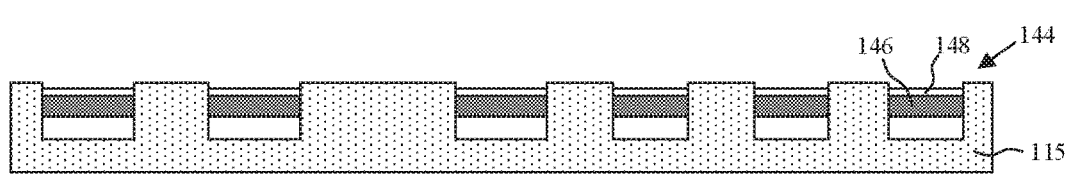
Figure 6G:
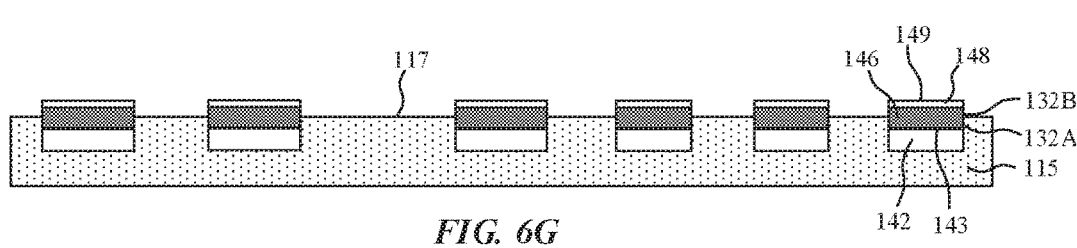

In a surface finish before etch-back fabrication sequence illustrated in FIG. 6G, the surface finishing layer 144 is then formed on the exposed bulk metal layer 142 within the openings 151 (recesses) in the build-up structure that resulted from removal of the barrier layer 150. In an embodiment, the surface finishing layer 144 is completely contained with the openings 151 in order to control the shape and height. A thickness of the build-up structure (e.g. top dielectric layer 115) is reduced at operation 4062 such that a top surface 149 of the surface finishing layer 144 protrudes from the build-up structure, and a top surface 143 of the bulk metal layer 142 is embedded in the build-up structure as illustrated in FIG. 6G. In an embodiment, etch-back is a plasma dry etching or wet chemical etching technique. For example, this may include $CF_4$ plasma chemistry or CMP.

For both the surface finish after etch-back fabrication sequence and the surface finish before etch-back fabrication sequence, the seed layer 302 etching operation does not attack the bulk metal layer 142 sidewalls, or for that matter sidewalls within what will become the recess or opening 151 in the build-up structure (e.g. top dielectric layer 115). This keeps the pad size as a design value in accordance with both sequences.

Figure 7A:
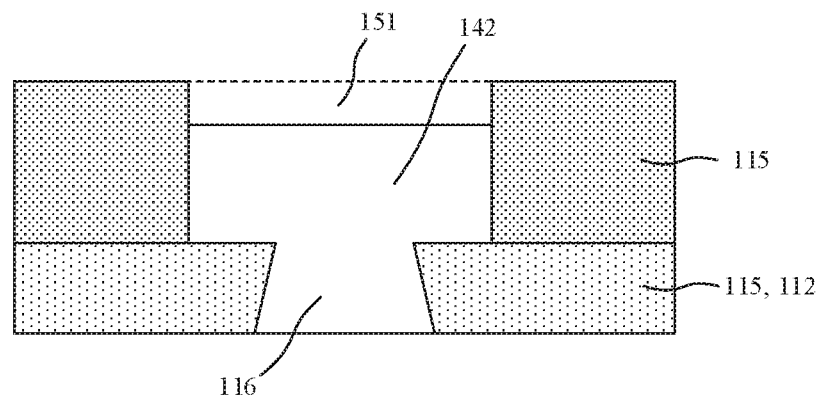
FIGS. 7A-7C are schematic cross-sectional side view illustrations of an SMT metal bump fabricated in accordance with a surface finish after etch-back fabrication sequence in accordance with an embodiment.
Figure 7B:
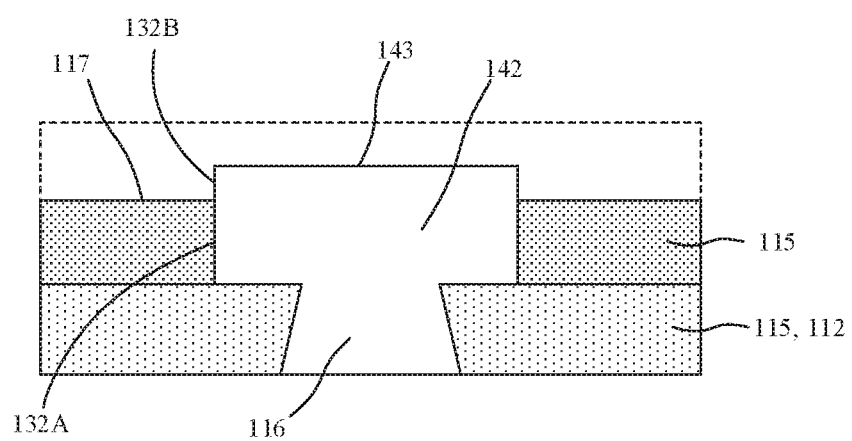
Figure 7C:
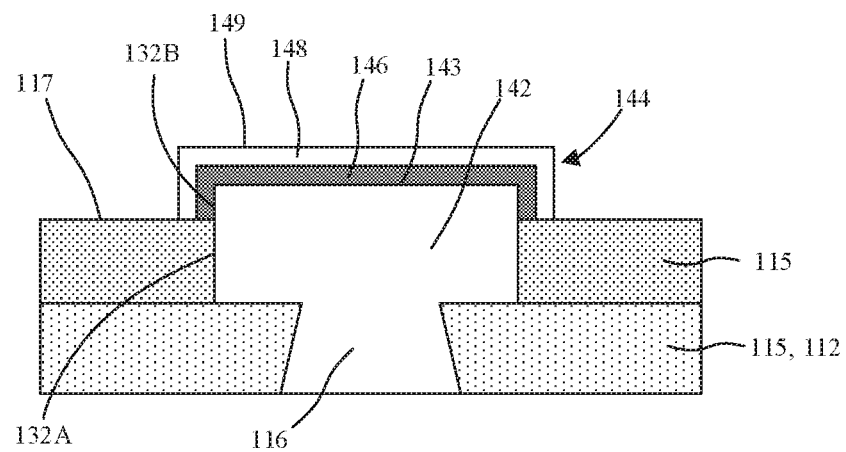
Figure 8A:
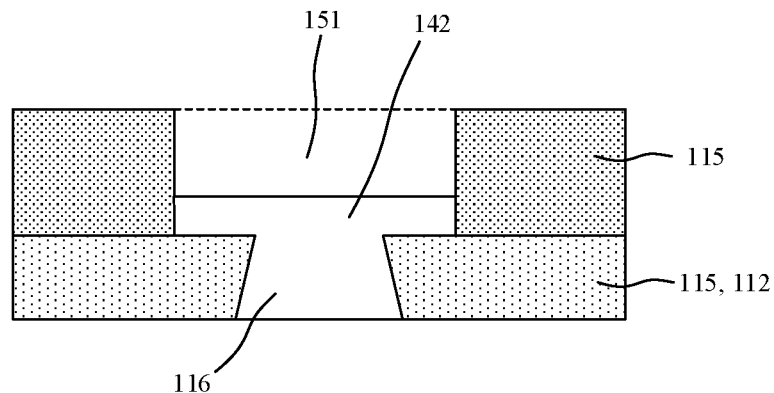
FIGS. 8A-8C are schematic cross-sectional side view illustrations of an SMT metal bump fabricated in accordance with a surface finish before etch-back fabrication sequence in accordance with an embodiment.
Figure 8B:
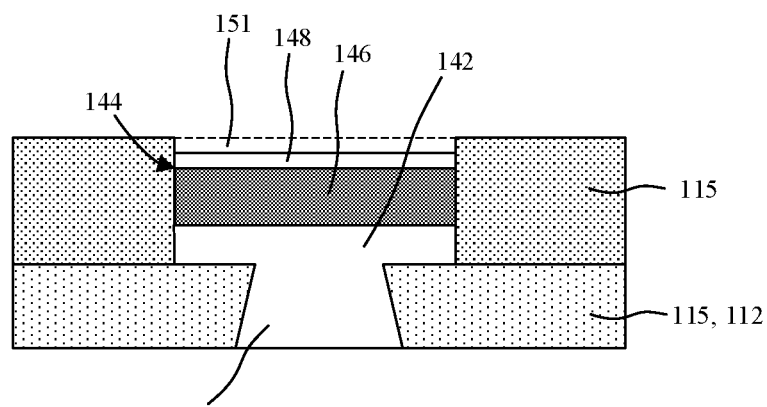
Figure 8C:
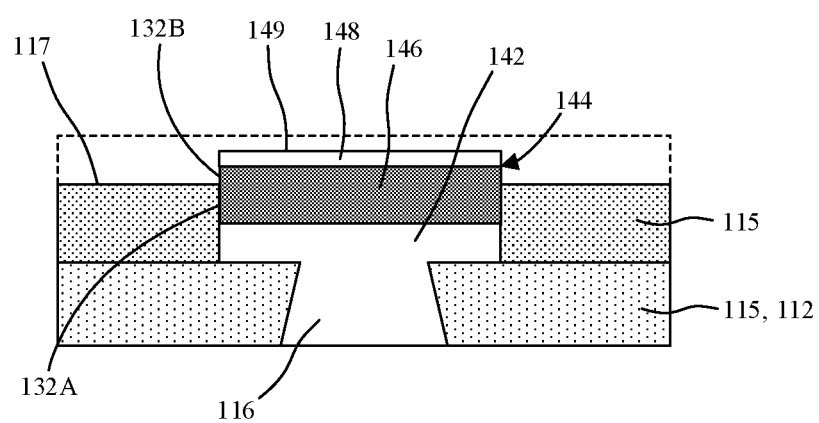

FIGS. 7A-7C are schematic cross-sectional side view illustrations of an SMT metal bump 122 fabricated in accordance with a surface finish after etch-back fabrication sequence in accordance with an embodiment. FIGS. 8A-8C are schematic cross-sectional side view illustrations of an SMT metal bump 122 fabricated in accordance with a surface finish before etch-back fabrication sequence in accordance with an embodiment.

Referring to FIG. 7A, the structure illustrates an opening 151 formed after removal of the barrier layer 150 at operation 4040. Also illustrated is the electrical and physical connection between the bulk metal layer 142 and via 116 formed in one or more dielectric layers 115, 112. FIG. 7B illustrates the bulk metal layer 142 top surface 143 raised above the topmost surface 117 of the build-up structure after etch-back at operation 4050. FIG. 7C illustrates the formation of the surface finishing layer 144 at operation 4052, which can also encapsulate the bulk metal layer 142 to provide chemical protection. The metal dam structures 124 may be processed similarly, with similar physical arrangements.

Referring to FIG. 8A, the structure illustrates an opening 151 formed after removal of the barrier layer 150 at operation 4040. Notably, the bulk metal layer 142 is thinner than in FIG. 7A, and the recess or opening 151 is deeper. Also illustrated is the electrical and physical connection between the bulk metal layer 142 and via 116 formed in one or more dielectric layers 115, 112. FIG. 8B illustrates the formation of the surface finishing layer 144 at operation 4060. As shown, the opening 151 may not be completely filled. This may help facilitate maintaining identical size of the SMT metal bumps 122. FIG. 8C illustrates the SMT metal bump 122 after etch-back at operation 4062. As shown, the surface finishing layer 144 again encapsulates the bulk metal layer 142 to provide chemical protection. The metal dam structures 124 may be processed similarly, with similar physical arrangements.

Figure 9A:
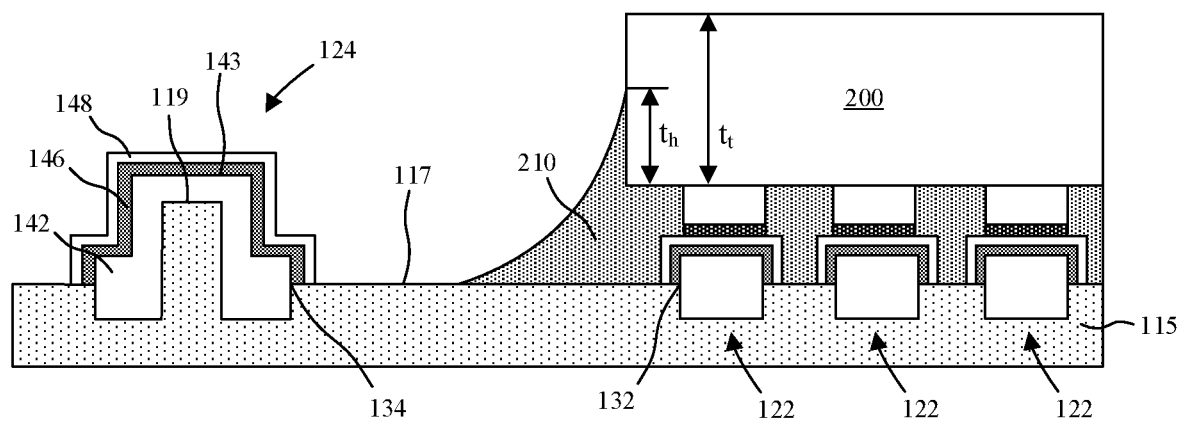
FIGS. 9A-9B are close-up cross-sectional side view illustrations of packaging substrate variations including a metal dam structure that protrudes above the array of SMT metal bumps in accordance with embodiments.
Figure 9B:
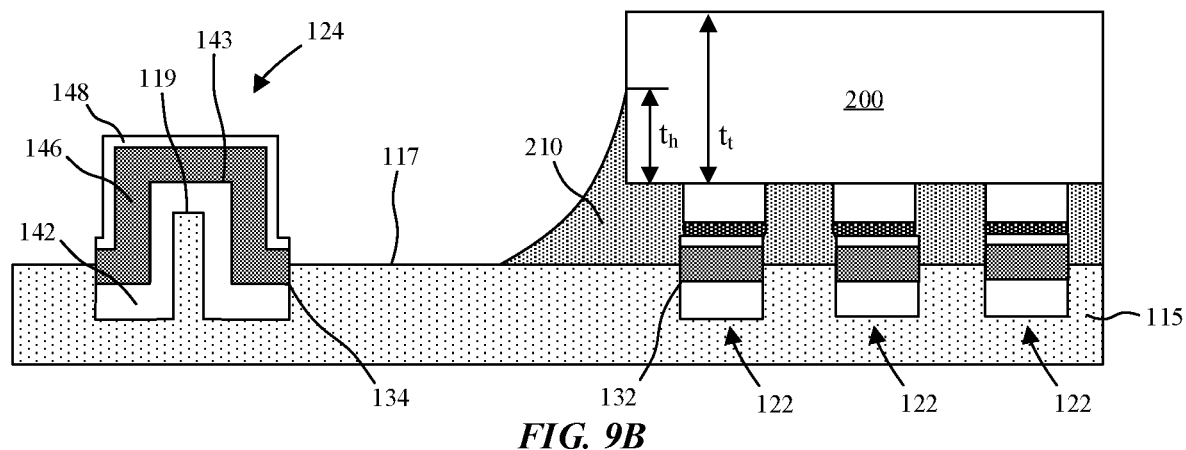
Figure 10A:
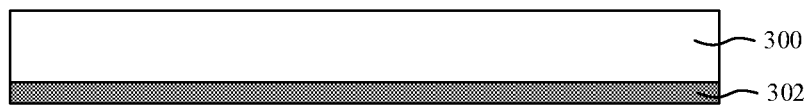
FIGS. 10A-10G are schematic cross-sectional side view illustrations of a surface finish after etch-back fabrication sequence used to form the structure of FIG. 9A in accordance with an embodiment.
Figure 10B:
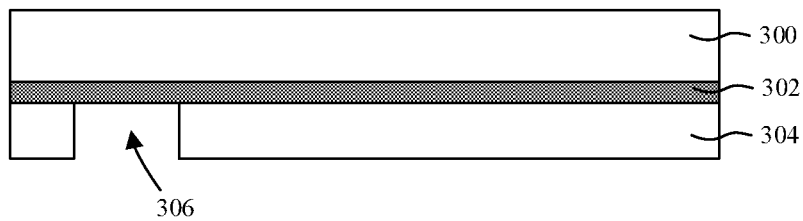
Figure 10C:
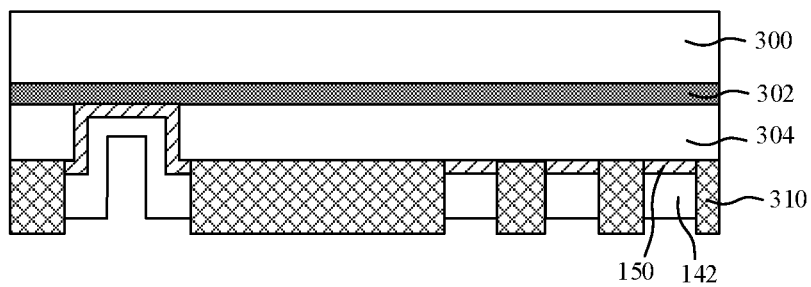
Figure 10D:
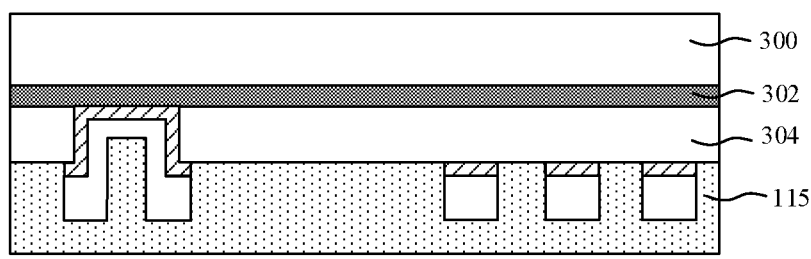
Figure 10E:
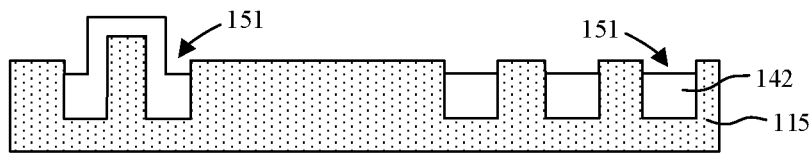
Figure 10F:
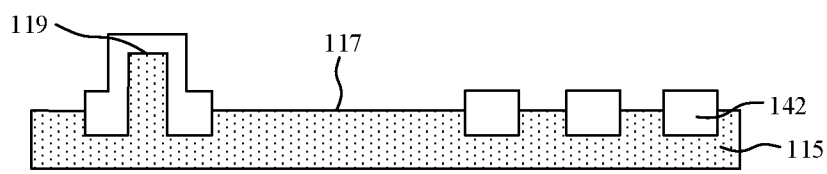
Figure 10G:
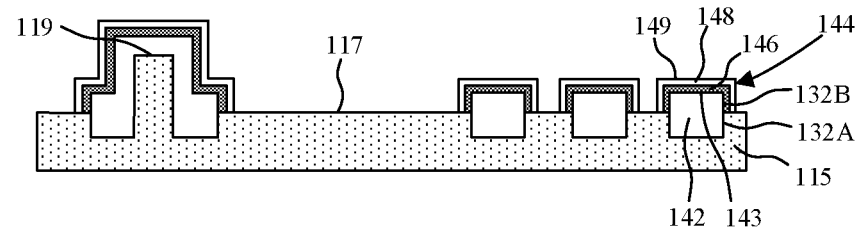
Figure 11A:
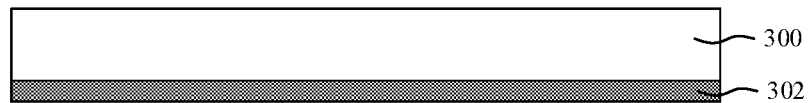
FIGS. 11A-11G are schematic cross-sectional side view illustrations of a surface finish after etch-back fabrication sequence used to form the structure of FIG. 9B in accordance with an embodiment.
Figure 11B:
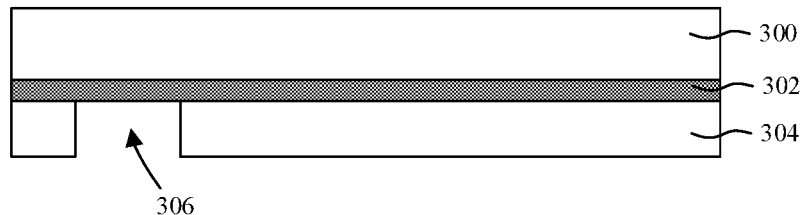
Figure 11C:
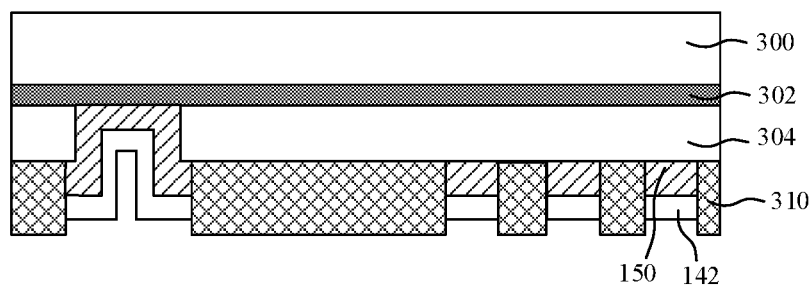
Figure 11D:
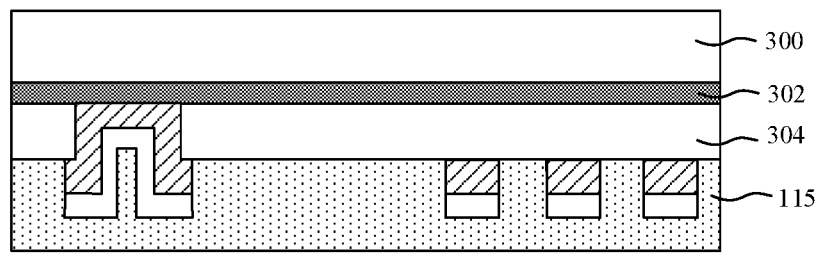
Figure 11E:
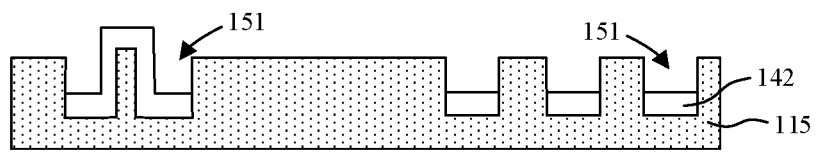
Figure 11F:
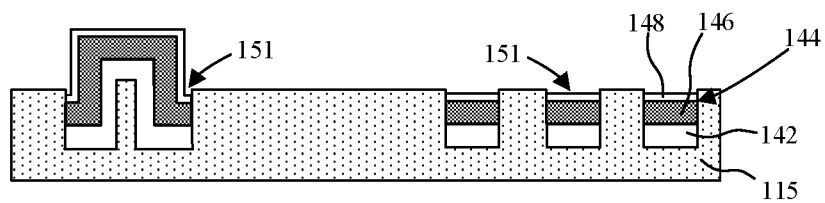
Figure 11G:
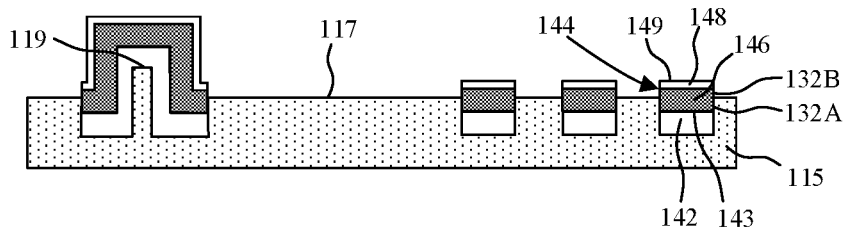

Referring now to FIGS. 9A-9B close-up cross-sectional side view illustrations are provided of packaging substrate variations including a metal dam structure that protrudes above the array of SMT metal bumps in accordance with embodiments. FIG. 9A is fabricated using a surface finish after etch-back fabrication sequence, such as that provided in FIGS. 10A-10G in accordance with an embodiment. FIG. 9B is fabricated using a surface finish before etch-back fabrication sequence, such as that provided in FIGS. 11A-11G in accordance with an embodiment. The packaging substrate variations and processing sequence variations share similarities to the structures and processing sequences already illustrated and described with regard to FIGS. 1-8C. Accordingly, in interest of clarity and conciseness the following description is focused on the particular variations rather than shared features and processes.

Referring to both FIG. 9A and FIG. 9B the metal dam structure 124 is illustrated as protruding above the array of SMT metal bumps 122. Furthermore, the build-up structure, or more specifically top dielectric layer 115 protrudes into an interior portion of the metal dam structure 124. Here a top surface 119 of the build-up structure inside the metal dam structure 124 is above the topmost surface 117 of the build-up structure immediately laterally adjacent to the metal dam structure 124, and also that adjacent to the SMT metal bumps 122. In both structures, the metal dam structure 124 may have a characteristic upside-down U-shape, or horseshoe shape, embedded in the build-up structure.

Referring now to FIGS. 10A-10B and FIGS. 11A-11B the processing sequence begins similarly as previously illustrated and described with regard to FIGS. 5A and 6A including the formation of a seed layer 302 on carrier substrate 300. A patterned dam layer 304 is then formed over the seed layer 302. In an embodiment, the dam layer 304 is a conductive layer, and may be a metal layer. For example, the dam layer 304 is a plated copper layer. The dam layer 304 may be formed by forming a patterned resist layer where opening 306 is illustrated, followed by plating, then stripping of the resist layer to create the dam layer 304 and opening 306. The processing sequences in FIGS. 10C-10G and FIGS. 11C-11G may then proceed similarly as those previously described and illustrated with regard to FIGS. 5B-5G and FIGS. 6B-6G, respectively.

Figure 12A:
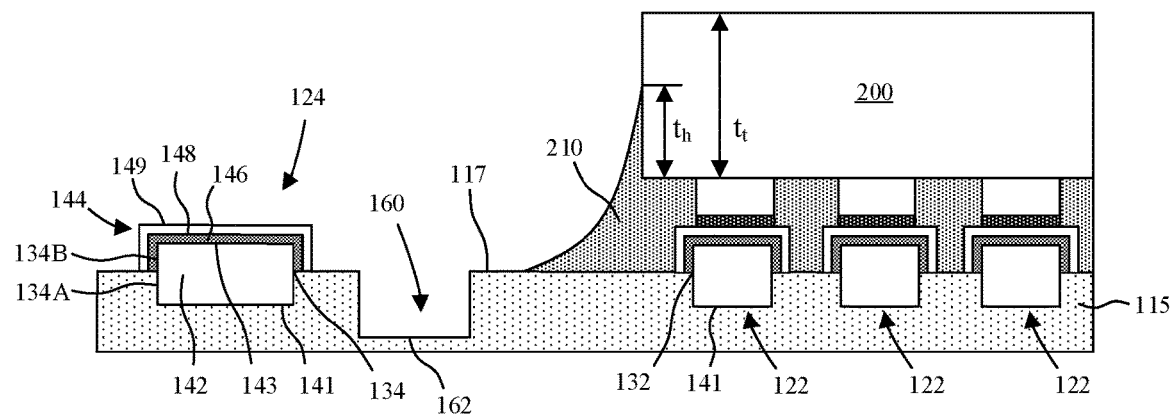
FIGS. 12A-12B are close-up cross-sectional side view illustrations of packaging substrate variations including a trench formed in the build-up structure between the array of SMT metal bumps and the metal dam structure in accordance with embodiments
Figure 12B:
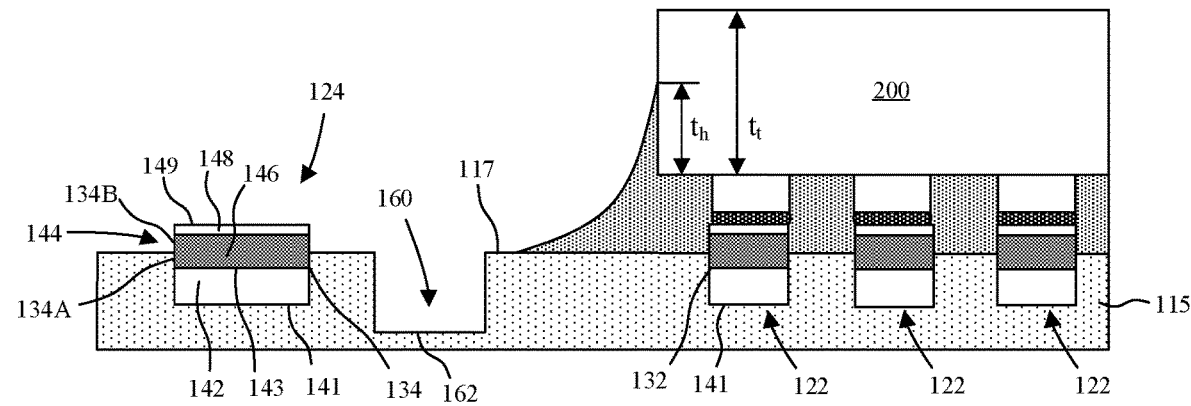

FIGS. 12A-12B are close-up cross-sectional side view illustrations of another packaging substrate variation including a trench formed in the build-up structure between the array of SMT metal bumps and the metal dam structure in accordance with embodiments. FIG. 12A is fabricated using a surface finish after etch-back fabrication sequence, such as that provided in FIGS. 13A-13F in accordance with an embodiment. FIG. 12B is fabricated using a surface finish before etch-back fabrication sequence, such as that provided in FIGS. 14A-11F in accordance with an embodiment. The packaging substrate variations and processing sequence variations share similarities to the structures and processing sequences already illustrated and described with regard to FIGS. 1-8C, accordingly in interest of clarity and conciseness the following description is focused on the particular variations rather than shared features and processes.

Referring to both FIG. 12A and FIG. 12B a trench 160 is formed in the build-up structure (e.g. top dielectric layer 115) between the array of SMT metal bumps 122 and the metal dam structure 124. The trench 160 may have a bottom surface 162 that is below a bottom surface 141 of the array of SMT metal bumps 122 and metal dam structure 124, which may be defined by the bulk metal layer 142. The trench 160 may completely surround a landing area 123A, 123B or only be around a portion of a landing area.

Figure 13A:
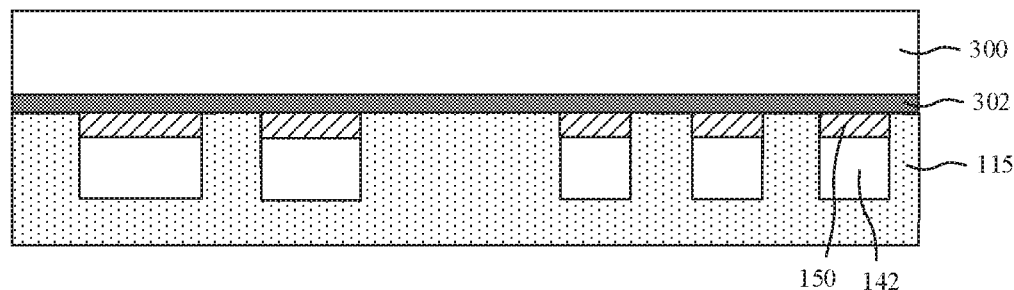
FIGS. 13A-13F are schematic cross-sectional side view illustrations of a surface finish after etch-back fabrication sequence used to form the structure of FIG. 12A in accordance with an embodiment.
Figure 13B:
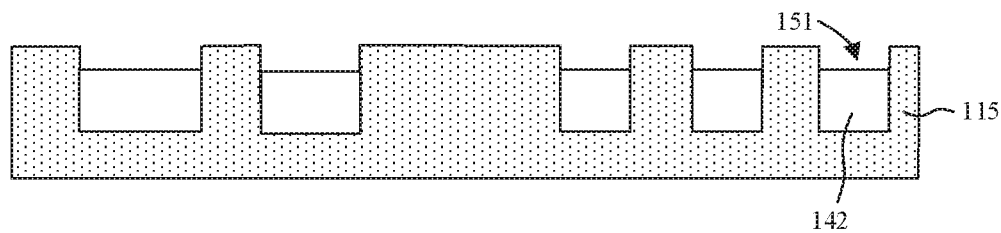
Figure 13C:
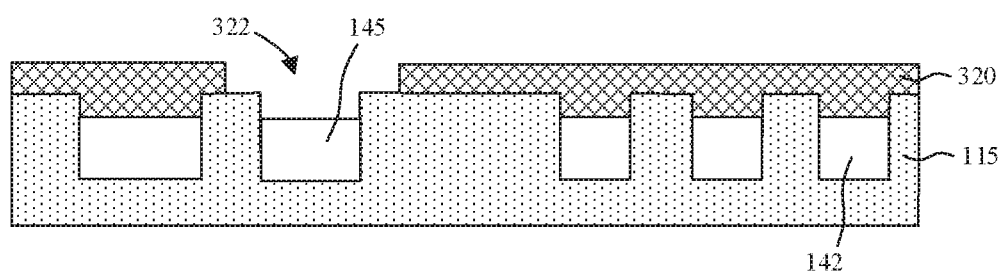
Figure 13D:
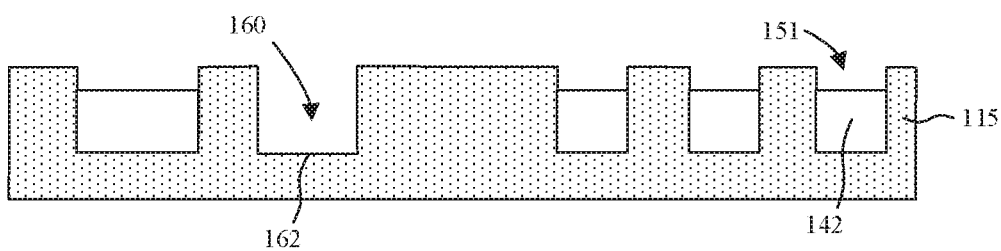
Figure 13E:
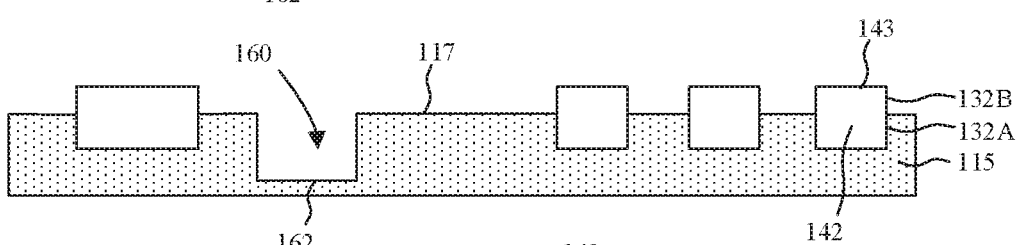
Figure 13F:
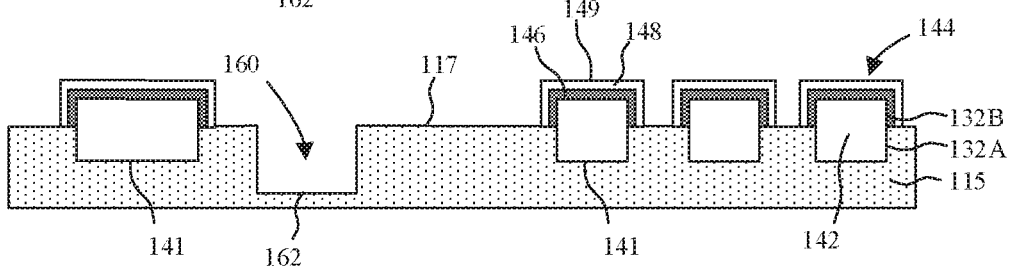
Figure 14A:
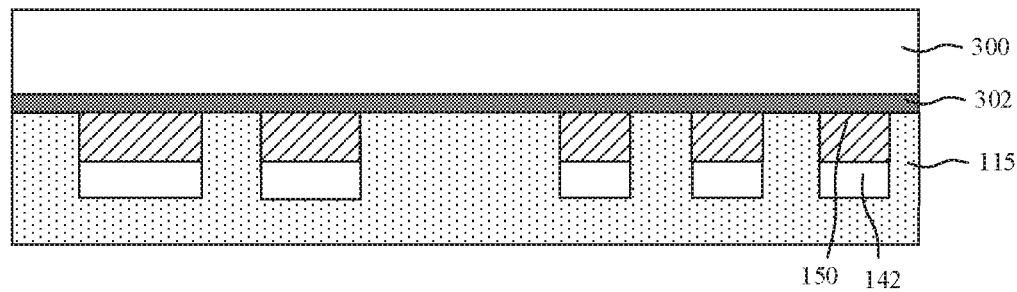
FIGS. 14A-14F are schematic cross-sectional side view illustrations of a surface finish after etch-back fabrication sequence used to form the structure of FIG. 12B in accordance with an embodiment.
Figure 14B:
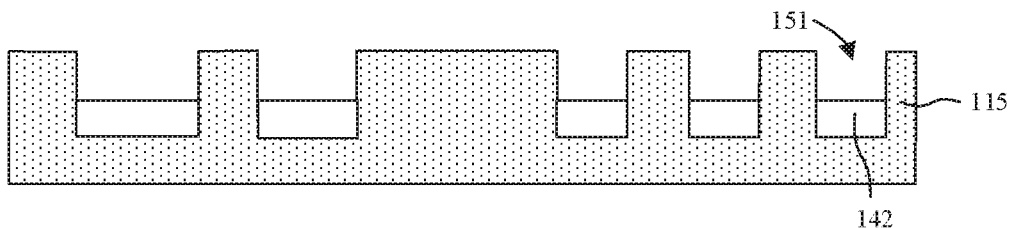
Figure 14C:
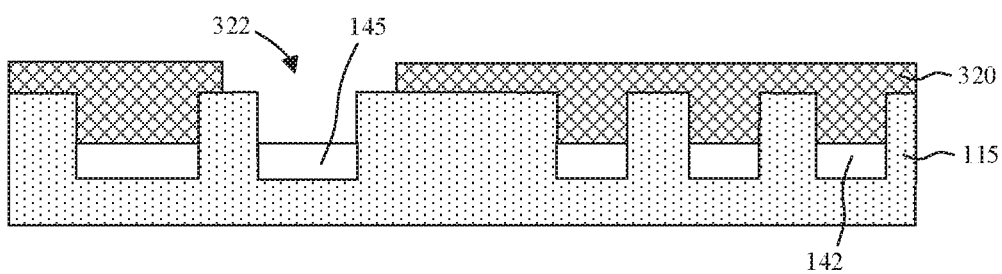
Figure 14D:
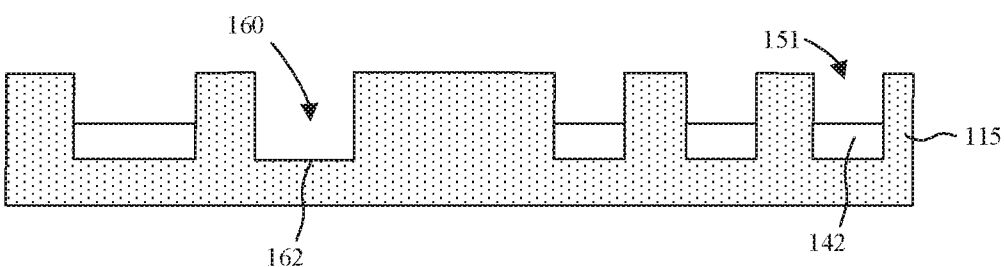
Figure 14E:
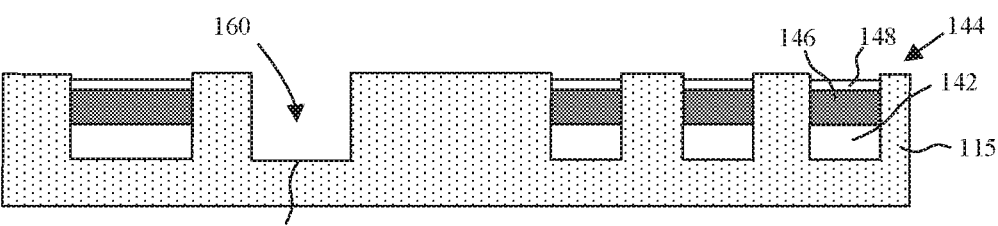
Figure 14F:
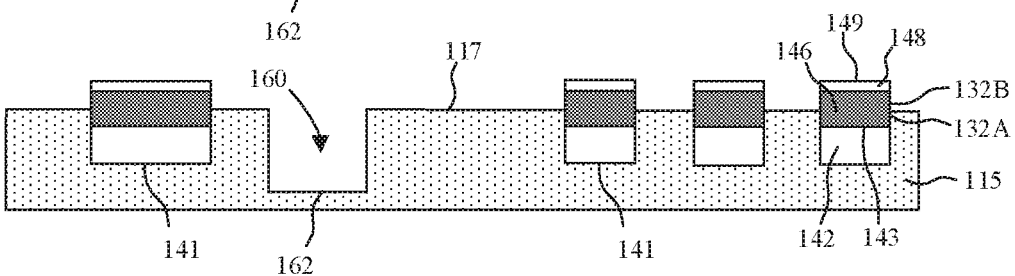

Referring now to FIGS. 13A-13B and FIGS. 14A-14B the processing sequence begins similarly as previously illustrated and described with regard to FIGS. 5A-5E and FIGS. 6A-6E. A mask layer 320 (e.g. resist) may then be formed over a dummy metal structure 145 in the bulk metal layer 142 as illustrated in FIGS. 13C and 14C, followed by etching to remove the dummy metal structure 145 as illustrated in FIGS. 13D and 14D, which also shows removal of the mask layer 320. The processing sequences in FIGS. 13E-13F and FIGS. 14E-14F may then proceed similarly as those previously described and illustrated with regard to FIGS. 5F-5G and FIGS. 6F-6G, respectively. Notably, during the etch-back sequences, the bottom surfaces 162 of the trenches 160 are also etched-back, such that they are lowered beneath the bottom surfaces of the bulk metal layer 142, and hence the bottom surface 141 of the array of SMT metal bumps 122 and metal dam structure 124.

It is to be appreciated that while the various structural variations and processing sequences in accordance with embodiments have been described and illustrated separately, that many of the structures and processing sequences may be combined. In utilizing the various aspects of the embodiments, it would become apparent to one skilled in the art that combinations or variations of the above embodiments are possible for forming SMT metal bumps and reinforcement structures within packaging substrates. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of forming a packaging substrate comprising:
    forming a patterned metal base layer on a carrier substrate, the patterned metal base layer including a bulk metal layer on a barrier layer;
    forming a build-up structure on the patterned metal base layer;
    removing the carrier substrate;
    removing the barrier layer;
    reducing a thickness of the build-up structure such that a top surface of the bulk metal layer protrudes from the build-up structure to form an array of surface mount (SMT) metal bumps partially embedded within the build-up structure and protruding from the build-up structure in a chip mount area, and a metal dam structure laterally adjacent to the array of SMT metal bumps partially embedded within the build-up structure and protruding from the build-up structure;
    wherein each SMT metal bump includes straight sidewalls for a portion of the SMT metal bump that is embedded in the build-up structure and a portion of the SMT metal bump that extends above a topmost surface of the build-up structure laterally adjacent to the SMT metal bump;
    wherein the metal dam structure includes straight sidewalls for a portion of the metal dam structure that is embedded in the build-up structure and a portion of the metal dam structure that extends above a topmost surface of the build-up structure laterally adjacent to the metal dam structure; and
    forming a surface finishing layer on the exposed bulk metal layer.

2. The method of claim 1, wherein reducing the thickness of the build-up structure comprises plasma etching or wet chemical etching.

3. The method of claim 1, wherein the surface finishing layer comprises a nickel-palladium-gold layer stack, and the bulk metal layer comprises copper.

4. The method of claim 1, wherein the metal dam structure laterally surrounds the array of SMT metal bumps.

5. The method of claim 1, wherein the metal dam structure comprises a plurality of parallel metal lines.

6. The method of claim 1, wherein the metal dam structure comprises an array of repeating geometrical shapes.

7. The method of claim 1, further comprising forming a trench in the build-up structure between the array of SMT metal bumps and the metal dam structure.

8. The method of claim 1, wherein forming the build-up structure includes forming a plurality of dielectric layers and a plurality of metal routing layers.

9. The method of claim 8, wherein the plurality of dielectric layers is plurality of non-glass reinforced organic material layers.

10. The method of claim 9, wherein the plurality of dielectric layers is a plurality of cured resin layers.

11. A method of forming a packaging substrate comprising:

forming a patterned metal base layer on a carrier substrate, the patterned metal base layer including a barrier layer and a bulk metal layer on the barrier layer;

forming a build-up structure on the patterned metal base layer;

removing the carrier substrate;

removing the barrier layer;

forming a surface finishing layer on the exposed bulk metal layer within an opening in the build-up structure formerly occupied by the barrier layer; and reducing a thickness of the build-up structure such that a top surface of the surface finishing layer protrudes from the build-up structure, and a top surface of the bulk metal layer is embedded in the build-up structure.

12. The method of claim 1, wherein reducing the thickness of the build-up structure comprises plasma etching or wet chemical etching.

13. The method of claim 11, further comprising:

forming the surface finishing layer on a plurality of openings in the build-up structure formerly occupied by the barrier layer; and reducing the thickness of the build-up structure such that the top surface of the surface finishing layer protrudes from the build-up structure to form an array of surface mount (SMT) metal bumps and a metal dam structure laterally adjacent to the array of SMT metal bumps.

14. The method of claim 13, wherein the surface finishing layer comprises a nickel layer, and the bulk metal layer comprises copper.

15. The method of claim 14, wherein the surface finishing layer comprises a nickel-palladium-gold layer stack, and the bulk metal layer comprises copper.

16. The method of claim 13, wherein the metal dam structure laterally surrounds the array of SMT metal bumps.

17. The method of claim 13, wherein the metal dam structure comprises a plurality of parallel metal lines.

18. The method of claim 13, wherein the metal dam structure comprises an array of repeating geometrical shapes.

19. The method of claim 13, further comprising forming a trench in the build-up structure between the array of SMT metal bumps and the metal dam structure.

20. The method of claim 13, wherein forming the build-up structure includes forming a plurality of dielectric layers and a plurality of metal routing layers.

21. The method of claim 20, wherein the plurality of dielectric layers is plurality of non-glass reinforced organic material layers.

22. The method of claim 21, wherein the plurality of dielectric layers is a plurality of cured resin layers.

* * * * *